(12) United States Patent
Campetella

(10) Patent No.: US 9,814,114 B2
(45) Date of Patent: Nov. 7, 2017

(54) LED-BASED LIGHTING ASSEMBLY HAVING MULTIPLE MODULES EACH ARRANGED WITH DIVERGENT LED LIGHT SOURCES OF PARTICULAR WAVELENGTHS

(71) Applicant: CLAY PAKY S.p.A., Seriate (IT)

(72) Inventor: Francesco Campetella, Pesaro (IT)

(73) Assignee: CLAY PAKY S.P.A., Seriate (IT)

( * ) Notice: Subject to any disclaimer, the term of this patent is extended or adjusted under 35 U.S.C. 154(b) by 0 days.

(21) Appl. No.: 15/257,428

(22) Filed: Sep. 6, 2016

(65) Prior Publication Data

US 2017/0079108 A1    Mar. 16, 2017

(30) Foreign Application Priority Data

Sep. 11, 2015  (IT) .................. 102015000050931

(51) Int. Cl.
| | |
|---|---|
| F21V 9/16 | (2006.01) |
| H05B 33/08 | (2006.01) |
| F21S 10/02 | (2006.01) |
| F21K 9/60 | (2016.01) |
| F21K 9/61 | (2016.01) |
| F21K 9/62 | (2016.01) |
| H01L 33/50 | (2010.01) |
| H05B 37/02 | (2006.01) |
| F21V 23/00 | (2015.01) |
| F21Y 113/10 | (2016.01) |

(Continued)

(52) U.S. Cl.
CPC ........... *H05B 33/0866* (2013.01); *F21K 9/60* (2016.08); *F21K 9/61* (2016.08); *F21K 9/62* (2016.08); *F21S 10/023* (2013.01); *H01L 33/504* (2013.01); *H05B 33/0851* (2013.01); *H05B 37/0227* (2013.01); *F21V 23/005* (2013.01); *F21W 2131/406* (2013.01); *F21Y 2101/00* (2013.01); *F21Y 2105/10* (2016.08); *F21Y 2113/10* (2016.08); *F21Y 2113/13* (2016.08); *F21Y 2115/10* (2016.08)

(58) Field of Classification Search
CPC ......... H01L 33/08; H01L 25/00; H01L 27/00; F21V 23/005; F21V 23/0442; F21Y 2113/10
USPC ....... 362/84, 227, 231, 234, 249.01, 249.02, 362/276, 800; 315/149, 150, 152, 158
See application file for complete search history.

(56) References Cited

U.S. PATENT DOCUMENTS 7,956,546 B2 * 6/2011 Hasnain .............. F21V 23/0442
                                                    315/200 R
2009/0046453 A1   2/2009 Kramer
(Continued)

FOREIGN PATENT DOCUMENTS

CN         203 258 423         10/2013

*Primary Examiner* — Thuy Vinh Tran
(74) *Attorney, Agent, or Firm* — Leason Ellis LLP

(57) ABSTRACT

An LED lighting module includes a substrate and multiple divergent types of LED light sources that have different wavelengths and are housed on the substrate. The multiple LED light sources include: a phosphor-converted amber source; a phosphor-converted green source; a direct emission red source; a direct emission green source; a direct emission blue source; and a direct emission cyan source. The module can further include a controllable power source unit configured to supply the LED light sources and a control unit to control the power supply unit.

14 Claims, 5 Drawing Sheets

(51) Int. Cl.
*F21W 131/406* (2006.01)
*F21Y 101/00* (2016.01)
*F21Y 105/10* (2016.01)
*F21Y 115/10* (2016.01)
*F21Y 113/13* (2016.01)

(56) References Cited

U.S. PATENT DOCUMENTS

| | | |
|---|---|---|
| 2010/0188022 A1 | 7/2010 | Gerlach et al. |
| 2012/0140463 A1 | 6/2012 | Kinzer et al. |
| 2013/0229785 A1* | 9/2013 | Harbers ................ F21V 7/0083 362/84 |
| 2015/0184813 A1* | 7/2015 | Harbers ............. C09K 11/0883 362/84 |
| 2015/0316218 A1* | 11/2015 | Harbers ................... F21K 9/50 362/84 |

* cited by examiner

LED-BASED LIGHTING ASSEMBLY HAVING MULTIPLE MODULES EACH ARRANGED WITH DIVERGENT LED LIGHT SOURCES OF PARTICULAR WAVELENGTHS

CROSS-REFERENCE TO RELATED PATENT APPLICATIONS

The present application claims the benefit of priority under 35 U.S.C. §119 of Italian patent application serial No. 102015000050931, filed Sep. 11, 2015, which is hereby incorporated by reference in its entirety.

TECHNICAL FIELD

The present invention relates to a LED lighting module and a lighting assembly having LED lighting modules, particularly for stage lights.

BACKGROUND OF THE INVENTION

The use of LEDs as light sources is becoming more widespread for the numerous advantages compared to traditional incandescent and fluorescent lamps, mainly as regards consumption, versatility and flexibility of control, which allows the most varied effects to be achieved. The LEDs are frequently used for the lighting of indoor and outdoor environments. Among the many uses, for example, LEDs can be advantageously exploited for the lighting of streets, monuments and architectural structures, in the entertainment industry for the implementation of stage lighting (both for effects and for manufacturing Wash Light type projectors). In the interior, LEDs are also often preferred for home lighting.

The lighting quality provided by the sources is crucial in many applications. In particular, it is preferred that the colour rendering of the sources be as natural as possible, as this strongly affects perception. The colour rendering is normally measured by a parameter, the so-called Colour Rendering Index CRI or Ra, which is determined according to a standardised procedure and provides objective evidence that the light from a source approximates the radiation of a black body at a given colour temperature.

The currently available LED sources are not yet fully satisfactory in terms of colour rendering. To improve the colour rendering, LED lighting modules have been proposed based on the combination of LED sources with different emission spectra. Nevertheless, the colour rendering index is not high enough or, at the least, the rendering is satisfactory only in a narrow range of colour temperatures. For example, in the entertainment industry, which requires an excellent colour rendering, the mandatory replacement of tungsten and halogen lamps is a problem perceived in an increasingly urgent way. In fact, the environmental and energy saving standards aim to prevent the use of low-efficiency sources, such as the incandescent lamps, which however have a colour rendering unmatched by other currently available discharge or LED sources.

SUMMARY OF THE INVENTION

The object of the present invention is therefore to provide a LED lighting module which allows for overcoming or at least mitigating the limitations described above and, in particular, for obtaining a high colour rendering index in a wide range of colour temperatures.

According to the present invention, a LED lighting module is provided, comprising a substrate and multiple LED light sources housed on the substrate, the LED light sources including:
a phosphor-converted amber source;
a phosphor-converted green source;
a direct emission red source;
a direct emission green source;
a direct emission blue source; and
a direct emission cyan source.

The specific indicated combination of LED light sources allows for obtaining a high colour rendering index, higher than 99 or at least 98, within an extremely wide range of colour temperatures, in particular between 2500 K and 7000 K.

According to one aspect of the invention, the phosphor-converted amber source has a first dominant wavelength comprised between 581 nm and 597 nm, preferably between 585 nm and 593 nm;
the phosphor-converted green source has a second dominant wavelength comprised between 559 nm and 575 nm, preferably between 563 nm and 571 nm;
the direct emission red source has a third dominant wavelength comprised between 622.5 nm and 632.5 nm, preferably between 625 nm and 630 nm;
the direct emission green source has a fourth dominant wavelength comprised between 517.5 nm and 527.5 nm, preferably between 520 nm and 525 nm;
the direct emission blue source has a fifth dominant wavelength comprised between 447.5 nm and 457.5 nm, preferably between 450 nm and 455 nm; and
the direct emission cyan source has a sixth dominant wavelength comprised between 480 nm and 520 nm, preferably between 480 nm and 490 nm, and more preferably between 482.5 nm and 487.5 nm.

The specific combination of wavelengths for the LED light sources provides maximum performance in terms of colour rendering of the LED emission module.

According to one aspect of the invention, the phosphor-converted amber source and the phosphor-converted green source have equal emitting areas.

According to one aspect of the invention, the direct emission red source, the direct emission green source and the direct emission blue source each have each an emitting area equal to half the emitting area of the phosphor-converted amber source and equal to half the emitting area of the phosphor-converted green source.

According to one aspect of the invention, a ratio between an emitting area of the direct emission cyan source and the emitting area of the phosphor-converted amber source is approximately 0.8 and a ratio between the emitting area of the direct emission cyan source and the emitting area of the phosphor-converted green source is approximately 0.8.

The indicated area ratios individually allow for the balancing of the contributions of the LED power sources, taking into account the maximum fluxes that may be required for each colour component, i.e. for each of the LED power sources, and for providing the total emitting area with optimal compactness.

According to one aspect of the invention, a lighting assembly is provided, which comprises multiple LED lighting modules, each comprising a substrate and multiple LED light sources housed on the substrate, the LED light sources including:
a phosphor-converted amber source;
a phosphor-converted green source;
a direct emission red source;

a direct emission green source;
a direct emission blue source; and
a direct emission cyan source.

According to one aspect of the invention, the lighting assembly comprises:

a controllable power supply unit, configured to supply the LED light sources, a photodetector responsive to light radiation in respective emission bands of the LED light sources and optically coupled to the LED light sources of at least one of the LED lighting modules; and a control unit configured to control the power supply unit on the basis of a response of the photodetector.

The photodetector allows for the detection of the flux actually emitted by each LED light source and allows the control unit to accurately control the fluxes emitted by each LED light source, so as to obtain the desired levels that optimize the colour rendering.

BRIEF DESCRIPTION OF THE DRAWINGS

For a better understanding of the invention, an embodiment thereof will now be described, purely by way of non limiting example and with reference to the accompanying drawings, wherein.

DETAILED DESCRIPTION OF THE INVENTION

Figure 1:
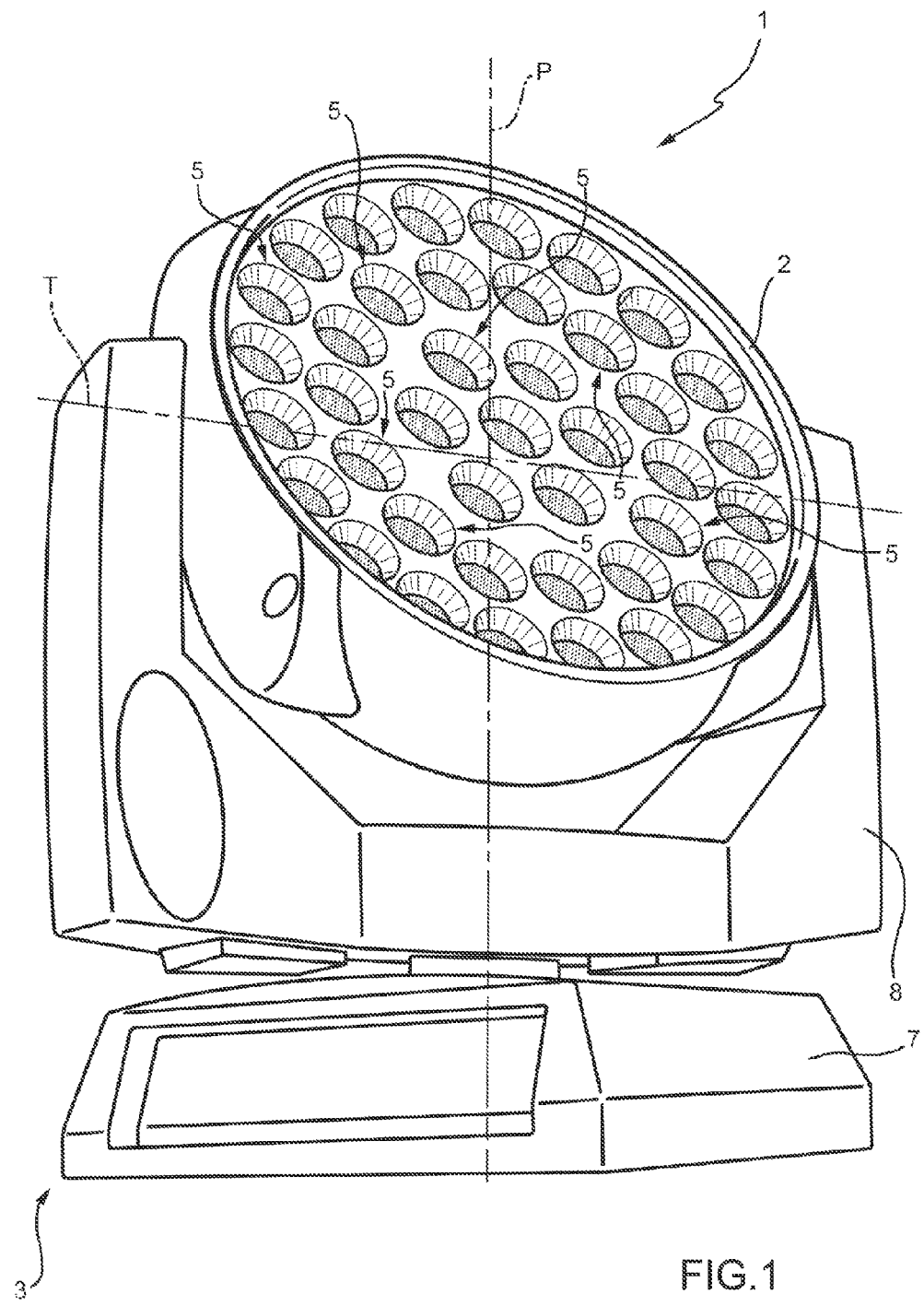
FIG. 1 is a perspective view of a lighting assembly.

In FIG. 1, a lighting assembly is shown with the reference number 1, in particular a "Wash Light" type projector, which comprises a casing 2, a support 3 configured to support and move the casing 2, and a plurality of LED lighting units 5 housed within the casing 2.

The support 3 comprises a base 7 and a fork 8 which extends along a first axis or pan axis P. The fork 8 is coupled to the base 7, so as to be able to rotate around the pan axis P, and supports the casing 2, which in turn can rotate around a second axis or tilt axis T perpendicular to the pan axis A. The casing 2 and the base 7 can accommodate electromechanical drives (not shown) for controlling the movements of the casing 2 and of the fork 8 around the tilt axis T and the pan axis P, respectively.

Figure 2:
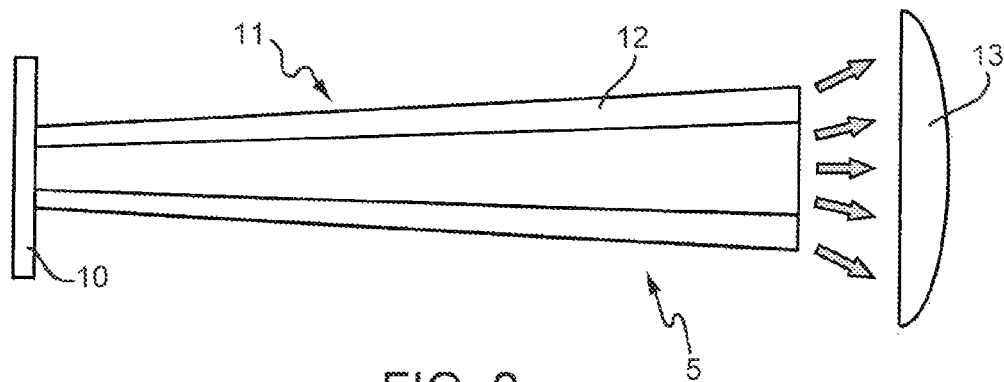
FIG. 2 is a simplified side view of a LED lighting unit incorporated into the lighting assembly of FIG. 1.

FIG. 2 shows by way of example one of the LED lighting units 5, which, in one embodiment, are identical to each other. The LED lighting unit 5 comprises a LED lighting module 10 and an optical assembly 11. In one embodiment, the optical assembly 11 comprises a mixing prism or "mixing rod" 12 and a lens 13. The mixing prism 12 is shaped so as to obtain a mixing of the light beams coming from the LED lighting module 10 by multiple reflections.

Figure 3:
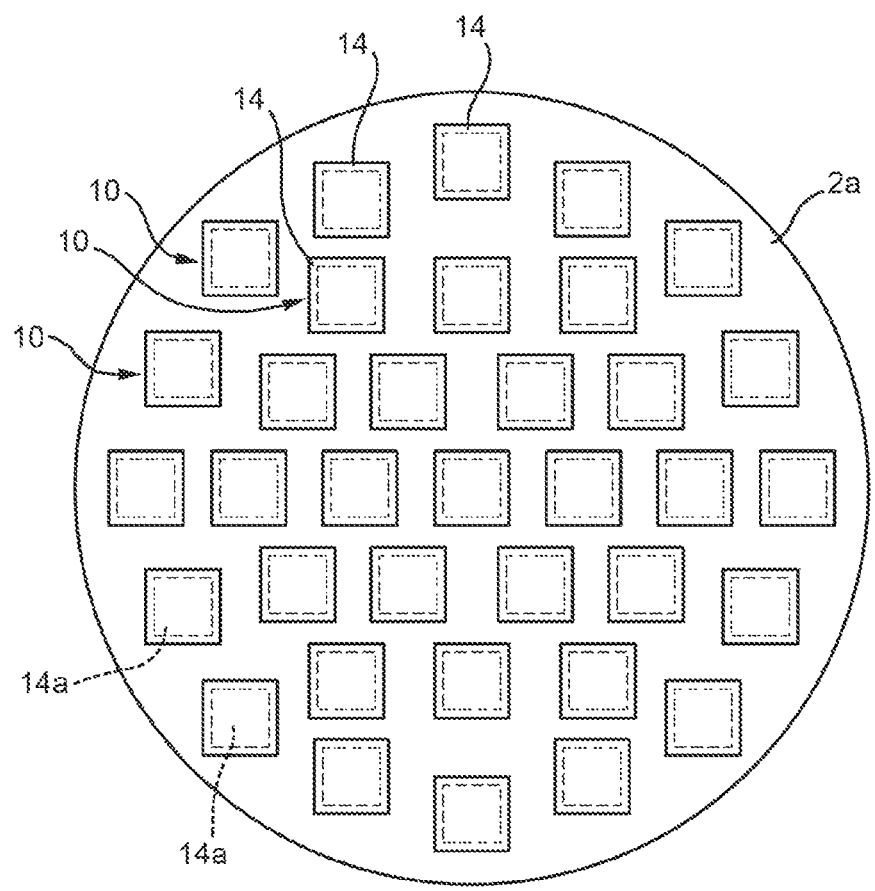
FIG. 3 is a simplified front view of a part of the lighting assembly of FIG. 1.
Figure 4:
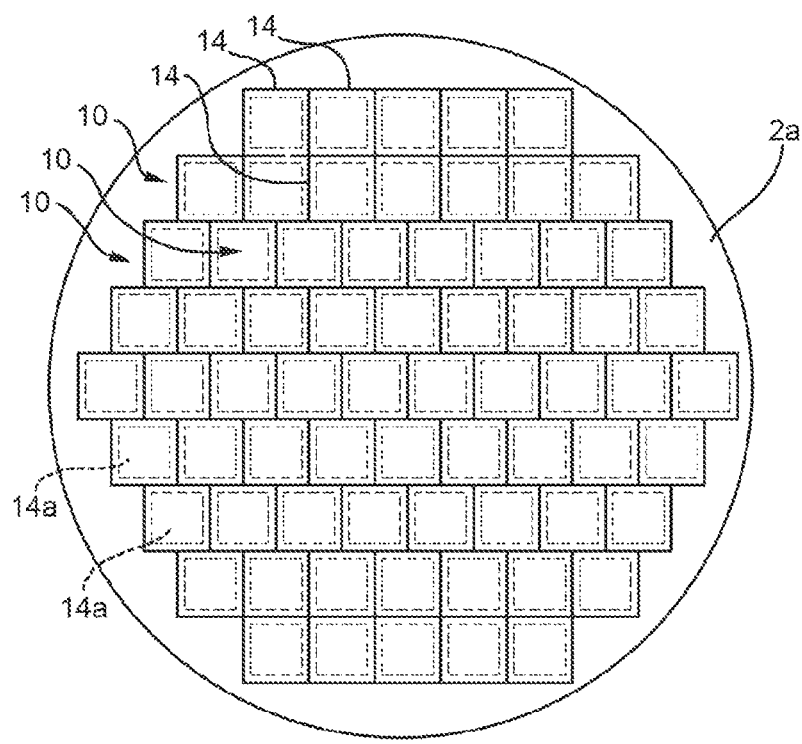
FIG. 4 is a simplified front view of a part of a different embodiment of a lighting assembly.
Figure 5:
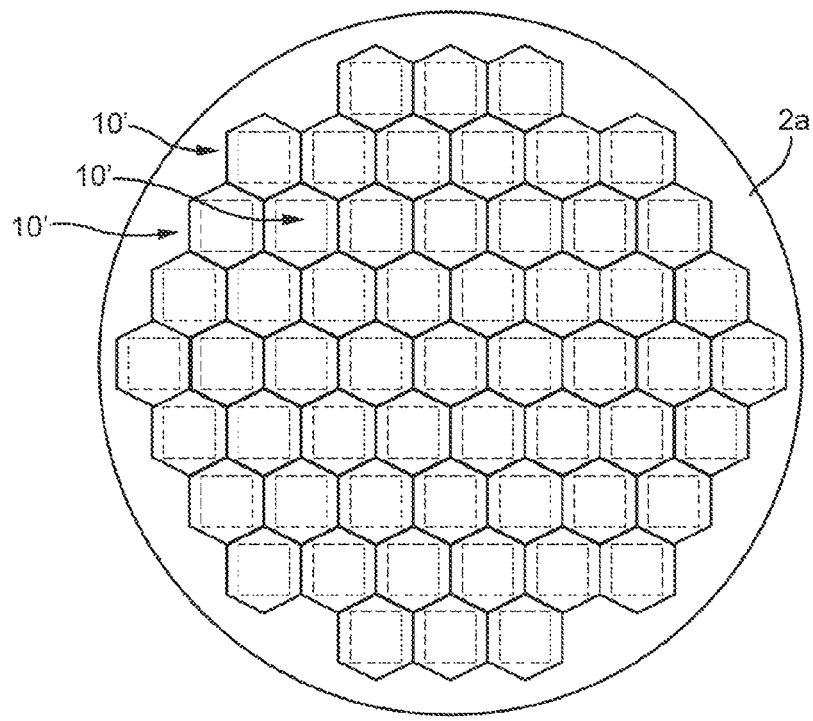
FIG. 5 is a simplified front view of a part of a further embodiment of a lighting assembly.

With reference to FIG. 3, each LED lighting module 10 comprises multiple LED light sources which are housed on an emitting region 14a of a substrate 14 and emit light radiation in respective emission bands. The LED lighting modules 10 are mounted on a plate 2a, which is in turn rigidly fixed to the casing 2 and, in one embodiment, they may have a substantially square or rectangular shape. Moreover, in the example of FIG. 3, the LED lighting modules 10 are arranged adjacent, but not contiguous, to each other. However, the shape and arrangement described are not to be considered limiting and may take any useful configuration. In particular, the LED lighting modules 10 may be arranged contiguous to each other, so as to obtain a complete tiling of the plate 2, as in the example of FIG. 4. Furthermore, in other embodiments, the LED lighting modules can be hexagonal, thereby respectively allowing for a complete honeycomb tiling (modules 10' in FIG. 5). In addition, by using diamond-shaped LED lighting modules (not shown), it is possible to obtain a complete Penrose tiling of the plate 2a. Furthermore, the plate 2a may be flat, or curved or rounded.

Figure 6:
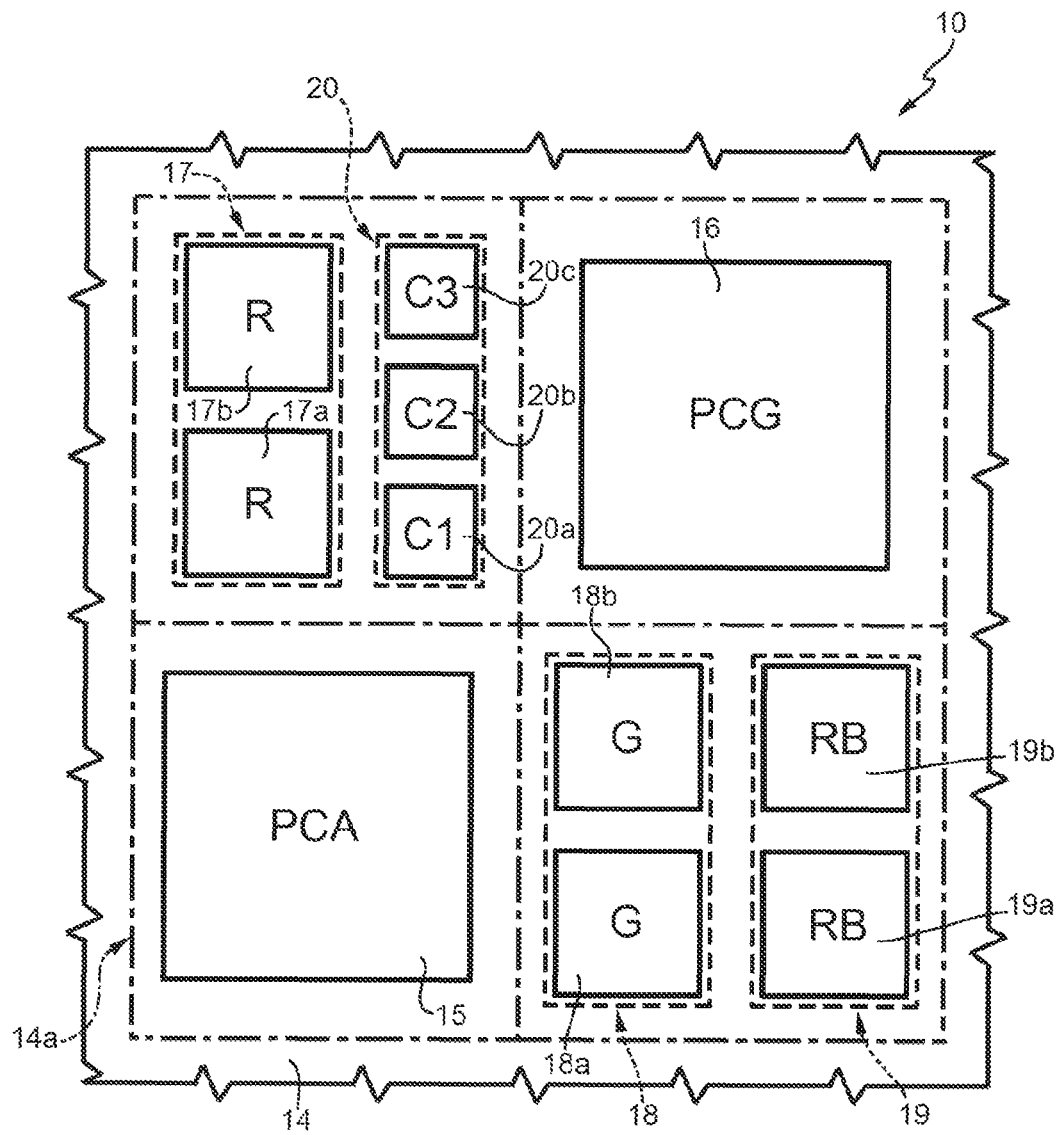
FIG. 6 is a simplified front view of a LED lighting module incorporated into the LED lighting unit of FIG. 2.

With reference to FIG. 6, the LED lighting module comprises at least:

a phosphor-converted amber source 15;
a phosphor-converted green source 16;
a direct emission red source 17;
a direct emission green source 18;
a direct emission blue source 19; and
a direct emission cyan source 20.

As mentioned, the LED light sources 15-20 emit in respective bands which can be characterized in terms of dominant wavelength, i.e. the wavelength at which the emission spectrum exhibits a maximum. In one embodiment:

the phosphor-converted amber source 15 has a first dominant wavelength comprised between 581 nm and 597 nm, preferably between 585 nm and 593 nm;

the phosphor-converted green source 16 has a second dominant wavelength comprised between 559 nm and 575 nm, preferably between 563 nm and 571 nm;

the direct emission red source 17 has a third dominant wavelength comprised between 622.5 nm and 632.5 nm, preferably between 625 nm and 630 nm;

the direct emission green source 18 has a fourth dominant wavelength comprised between 517.5 nm and 527.5 nm, preferably between 520 nm and 525 nm;

the direct emission blue source 19 has a fifth dominant wavelength comprised between 447.5 nm and 457.5 nm, preferably between 450 nm and 455 nm; and the direct emission cyan source 20 has a sixth dominant wavelength comprised between 480 nm and 520 nm, preferably between 480 nm and 490 nm, and more preferably between 482.5 nm and 487.5 nm.

Each LED light source 15-20 is defined by one or more respective emitters. In a non-limiting embodiment, the LED light sources 15-20 are defined as follows.

The phosphor-converted amber source 15 and the phosphor-converted green source 16 are defined by respective individual emitters, for example with an emitting area of 1 mm×1 mm.

The direct emission red source 17 comprises a first direct emission red emitter 17a and a second direct emission red emitter 17b identical to each other, for example having an emitting area of 0.5 mm×0.5 mm, and which are adjacent to one another.

The direct emission green source 18 comprises a first direct emission green emitter 18a and a second direct emission green emitter 18b identical to each other, for example having an emitting area of 0.5 mm×0.5 mm, and which are adjacent to one another.

The direct emission blue source 19 comprises a first direct emission blue emitter 19a and a second direct emission blue emitter 19b identical to each other, for example having an emitting area of 0.5 mm×0.5 mm, and which are adjacent to one another.

The direct emission cyan source 20 comprises a first direct emission cyan emitter 20a and a second direct emission cyan emitter 20b, having respective dominant wavelengths comprised between 469 nm and 475 nm, and a third direct emission cyan emitter having a respective dominant wavelength comprised between 497.5 nm and 502.5 nm. The first direct emission cyan emitter 20a, the second direct emission cyan emitter 20b and the third direct emission cyan emitter 20c have equal emitting areas, for example 0.3 mm×0.3 mm, and are adjacent to each other.

Therefore, the direct emission red source 17, the direct emission green source 18 and the direct emission blue source 19 each have an emitting area equal to approximately half the emitting area of the phosphor-converted amber source 15 and of the phosphor-converted green source 16. The ratio between the emitting area of the direct emission cyan source 20 and the emitting area of the phosphor-converted amber source 15, and the ratio between the emitting area of the direct emission cyan source 20 and the emitting area of the phosphor-converted green source 16 are both approximately 0.8.

The LED light sources 15-20 are arranged on the substrate 14 so as to optimize light emission, thus favouring the mixing of the beams coming from the different sources and minimizing the accidental excitation of the phosphor-converted sources 15, 16 by the radiation emitted by the other sources.

In one embodiment, the phosphor-converted amber source 15 and the phosphor-converted green source 16 are opposite to each other with respect to a central region of a portion of the substrate occupied by the LED light sources. More precisely, the LED light sources 15-20 occupy a substantially quadrangular emitting region 14a of the substrate 14. A central portion 14b of the emitting region 14 may coincide with the geometrical centre of the substrate 14. The phosphor-converted amber source 15 and the phosphor-converted green source 16 are housed in opposite quadrants of the emitting region 14a which, in one embodiment, are defined by a pair of perpendicular lines. A first set of sources, including the direct emission red source 17 and the direct emission cyan source 20, is housed in one of the remaining quadrants of the emitting region 14a. A second set of sources, including the direct emission green source 18 and the direct emission blue source 19, is housed in the last available quadrant, opposite to the quadrant where the first set of sources is located. Furthermore, the direct emission cyan source 20 is arranged between the direct emission red source 17 and the phosphor-converted green source 16. In general, the emitters of each of the direct emission sources (direct emission red source 17, direct emission green source 18, direct emission blue source 19 and direct emission cyan source 20) are aligned in a parallel direction at the respective sides of the emitting region 14a of the substrate 14. Moreover, the direct emission red source 17 and the direct emission blue source 19 are arranged on an outer rim of the emitting region 14a. In this way, it is possible to improve the cooling of the emitters of the direct emission red source 17 and of the direct emission blue source 19, minimizing the colour drift induced by temperature changes.

The described combination and arrangement of sources allow for the optimization of both the occupation of the area, and the mixing of the beams emitted.

Figure 7:
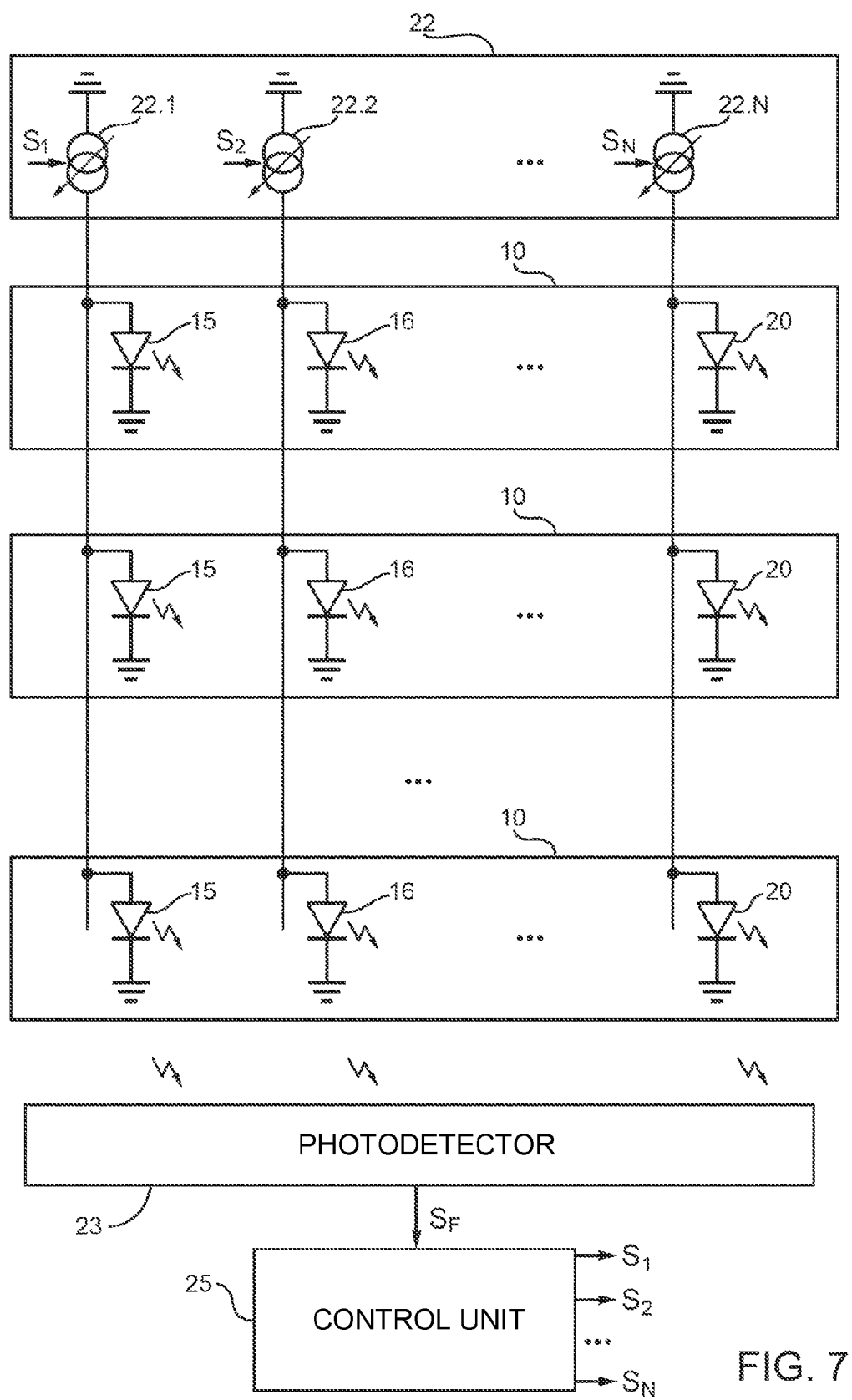
FIG. 7 is a simplified circuit diagram of the lighting assembly of FIG. 1.

With reference to FIG. 7, the lighting assembly 1 comprises a power supply unit 22, a photodetector 23 and a control unit 25.

The supply unit 22 may be controlled to supply the LED light sources on the basis of the response of the photodetector 23, which is responsive to light radiation in respective emission bands of the LED light sources 15-20 and is optically coupled to the LED light sources 15-20 of at least one of the LED lighting modules 10. The photodetector 23 may be, for example, a microspectrometer responsive in the emission band range of the LED light sources 15-20 or a conventional RGB sensor that uses a time division procedure for controlling the colour point and colour rendering. The optical coupling with the LED light sources 15-20 of the lighting modules 10 may be obtained by means of a light guide, not shown here.

More specifically, the power supply unit 22 comprises a plurality of power sources 22.1, . . . , 22.N which can be controlled independently of each other. The power sources 22.1, . . . , 22.N may be, for example, PWM mode-control switching current sources and may include independent and separate power supplies or separate outputs of a single power supply assembly. There is an number N of power sources 22.1, . . . , 22.N equal to the number of types of LED light sources 15-20 present in the LED lighting modules 10 (six in the illustrated embodiment). Each power source 22.1, . . . , 22.N is coupled to a respective type of LED light source 15-20 and is controlled by the control unit 25 independently of the other power sources 22.1, . . . , 22.N. For example, all the phosphor-converted amber sources 15 are supplied by a respective power source 22.1; all the phosphor-converted green sources 16 are supplied by a respective power source 22.2, and so forth, as shown in FIG. 7. In this way, the LED light sources 15-20 of a single lighting module 10 can be controlled independently of each other.

In one embodiment, the control unit 25 is configured to control the LED light sources 15-20 on the basis of the colour temperature and of the response of the photodetector 23. In practice, the photodetector 23 provides a feedback signal $S_F$ which is indicative of the light flux emitted by each LED light source 15-20. The control unit 25 receives the feedback signal $S_F$ from the photodetector 23 and determines a respective pilot signal $S_1$, . . . , $S_N$ for each of the power sources 22.1, . . . , 22.N. In practice, the control unit 25 weighs the contribution of each LED light source 15-20 so as to obtain a high colour rendering index Ra in a wide range of colour temperatures, for example between 2500 K and 7000 K. Particularly, the control unit 25 is configured to control the LED light sources 15-20 in accordance with the following normalized light flux table (the values are expressed in percentage).

|  | T1 2500k | T2 3000k | T3 4000k | T4 5000k | T5 6000k | T6 7000k |
|---|---|---|---|---|---|---|
| phosphor-converted amber source 15 | 9.24 | 7.10 | 4.77 | 3.34 | 3.30 | 3.91 |
| phosphor-converted green source 16 | 2.06 | 1.95 | 7.74 | 9.26 | 8.15 | 4.17 |
| direct emission red source 17 | 0.32 | 0.58 | 1.03 | 1.47 | 1.79 | 2.07 |
| direct emission green source 18 | 2.89 | 4.09 | 5.06 | 6.38 | 8.01 | 9.19 |
| direct emission blue source 19 | 41.53 | 34.61 | 29.90 | 25.55 | 18.54 | 10.00 |
| direct emission cyan source 20 | 43.96 | 51.68 | 51.50 | 54.00 | 60.21 | 70.67 |

The following table shows, for each of the combinations for the colour temperatures T1-T6, the values of the corresponding special parameters R1-R8 defined by the International Commission on Illumination (Commission Internationale de l'Éclairage, CIE) and Ra, the corresponding colour rendering index.

|    | T1     | T2     | T3     | T4     | T5     | T6     |
|----|--------|--------|--------|--------|--------|--------|
| R1 | 100.00 | 100.00 | 100.00 | 100.00 | 99.00  | 99.00  |
| R2 | 100.00 | 100.00 | 100.00 | 100.00 | 99.00  | 100.00 |
| R3 | 96.00  | 98.00  | 98.00  | 99.00  | 100.00 | 99.00  |
| R4 | 99.00  | 100.00 | 99.00  | 100.00 | 100.00 | 99.00  |
| R5 | 100.00 | 100.00 | 100.00 | 100.00 | 99.00  | 99.00  |
| R6 | 98.00  | 99.00  | 99.00  | 98.00  | 98.00  | 98.00  |
| R7 | 99.00  | 98.00  | 99.00  | 98.00  | 99.00  | 100.00 |
| R8 | 100.00 | 99.00  | 99.00  | 97.00  | 99.00  | 99.00  |
| Ra | 99.00  | 99.25  | 99.25  | 99.00  | 99.13  | 99.13  |

In one embodiment, in order to obtain a total flux of approximately 340-380 lm for each LED lighting module 10, the control unit 25 uses the light flux table (the values are expressed in lumens):

|                                    | T1 2500k | T2 3000k | T3 4000k | T4 5000k | T5 6000k | T6 7000k |
|------------------------------------|----------|----------|----------|----------|----------|----------|
| phosphor-converted amber source 15 | 34.5     | 26.9     | 18       | 12.3     | 11.8     | 13.6     |
| phosphor-converted green source 16 | 7.7      | 7.4      | 29.2     | 34.1     | 29.1     | 14.5     |
| direct emission red source 17      | 1.2      | 2.2      | 3.9      | 5.4      | 6.4      | 7.2      |
| direct emission green source 18    | 10.8     | 15.5     | 19.1     | 23.5     | 28.6     | 32       |
| direct emission blue source 19     | 155.1    | 131.2    | 112.8    | 94.1     | 66.2     | 34.8     |
| direct emission cyan source 20     | 164.2    | 195.9    | 194.3    | 198.9    | 215      | 246      |

The contributions of each LED light source 15-20 for intermediate colour temperature values may be obtained from the control unit 25 by interpolation.

The feedback control based on the response of the photodetector 23 allows the fluxes emitted by each LED light source 15-20 to be accurately maintained at the desired level. In particular, the feedback control advantageously makes it possible to compensate for the dependence of the fluxes emitted by the LED light sources 15-20 upon unpredictable factors, such as the operating temperature of the LED light sources 15-20 (not known), the process variability, whereby the emission characteristics of the LED light sources 15-20 may not be identical to the nominal characteristics, and the decay due to ageing.

In this way, it is possible to balance the different contributions to obtain a colour rendering index Ra consistently higher than 99 or at least higher than 98 within an extremely wide range of colour temperatures.

In addition, the ability to independently control the different LED light sources 15-20 provides additional effects. For example, the lighting modules 10 can be controlled to obtain beams with any colour combination, including the colours of the direct emission sources, as well as to precisely control the colour temperature, and to obtain dimming functions.

Lastly, it is clear that modifications and variations may be made to the LED lighting module described herein without departing from the scope of the appended claims.

The invention claimed is:

1. An LED lighting module comprising a substrate and a plurality of LED light sources housed on the substrate, the plurality of LED light sources including:
   a phosphor-converted amber source;
   a phosphor-converted green source;
   a direct emission red source;
   a direct emission green source;
   a direct emission blue source; and
   a direct emission cyan source;
   wherein the direct emission cyan source comprises a first direct emission cyan emitter and a second direct emission cyan emitter having respective dominant wavelengths comprised between 469 nm and 475 nm and a third direct emission cyan emitter having a respective dominant wavelength comprised between 497.5 nm and 502.5 nm.

2. The LED lighting module according to claim 1, wherein:
   the phosphor-converted amber source has a first dominant wavelength comprised between 581 nm and 597 nm;
   the phosphor-converted green source has a second dominant wavelength comprised between 559 nm and 575 nm;
   the direct emission red source has a third dominant wavelength comprised between 622.5 nm and 632.5 nm;
   the direct emission green source has a fourth dominant wavelength comprised between 517.5 nm and 527.5 nm; and
   the direct emission blue source has a fifth dominant wavelength comprised between 447.5 nm and 457.5 nm.

3. The LED lighting module according to claim 2, wherein:
   the first dominant wavelength is between 585 nm and 593 nm;
   the second dominant wavelength is between 563 nm and 571 nm;
   the third dominant wavelength is between 625 nm and 630 nm;
   the fourth dominant wavelength is between 520 nm and 525 nm; and
   the fifth dominant wavelength is between 450 nm and 455 nm.

4. The LED lighting module according to claim 1, wherein the first direct emission cyan emitter, the second direct emission cyan emitter and the third direct emission cyan emitter have equal emitting areas.

5. The LED lighting module according to claim 1, wherein:
   the direct emission red source comprises a first direct emission red emitter and a second direct emission red emitter having equal emitting areas;
   the direct emission green source comprises a first direct emission green emitter and a second direct emission green emitter having equal emitting areas; and
   the direct emission blue source comprises a first direct emission blue emitter and a second direct emission blue emitter having equal emitting areas.

6. The LED lighting module according to claim 1, wherein the phosphor-converted amber source and the phosphor-converted green source have equal emitting areas.

7. The LED lighting module according to claim 6, wherein the direct emission red source, the direct emission green source and the direct emission blue source each have an emitting area equal to half the emitting area of the phosphor-converted amber source and equal to half the emitting area of the phosphor-converted green source.

8. The LED lighting module according to claim 6, wherein a ratio between an emitting area of the direct emission cyan source and the emitting area of the phosphor-converted amber source is approximately 0.8 and a ratio between the emitting area of the direct emission cyan source and the emitting area of the phosphor-converted green source is approximately 0.8.

9. The LED lighting module according to claim 1, wherein the phosphor-converted amber source and the phosphor-converted green source are arranged opposite to each other with respect to a central region of a portion of the substrate occupied by the plurality of LED light sources.

10. An LED lighting module comprising a substrate and a plurality of LED light sources housed on the substrate, the plurality of LED light sources including:
    a phosphor-converted amber source;
    a phosphor-converted green source;
    a direct emission red source;
    a direct emission green source;
    a direct emission blue source; and
    a direct emission cyan source;
    wherein the plurality of LED light sources occupy a substantially quadrangular emitting region and wherein the phosphor-converted amber source and the phosphor-converted green source are housed in opposite quadrants of the emitting region;
    wherein a first set of sources, including the direct emission red source and the direct emission cyan source, and a second set of sources, including the direct emission green source and the direct emission blue source, are housed in opposite quadrants of the emitting region.

11. The lighting module according to claim 10, wherein the direct emission red source and the direct emission blue source are arranged on an outer rim of the emitting region.

12. A lighting assembly comprising a plurality of LED lighting modules, at least one of the plurality of LED lighting modules comprising a substrate and a plurality of LED light sources housed on the substrate, the plurality of LED light sources including:
    a phosphor-converted amber source;
    a phosphor-converted green source;
    a direct emission red source;
    a direct emission green source;
    a direct emission blue source;
    a direct emission cyan source;
    a controllable power supply unit, configured to supply the plurality of LED light sources, a photodetector responsive to light radiation in respective emission bands of the plurality of LED light sources and optically coupled to the plurality of LED light sources of the at least one of the plurality of LED lighting modules; and
    a control unit configured to control the power supply unit on the basis of a response of the photodetector;
    wherein the control unit is configured to control the plurality of LED light sources on a basis of the colour temperature in accordance with a normalized light flux table (%):

|  | T1 2500k | T2 3000k | T3 4000k | T4 5000k | T5 6000k | T6 7000k |
|---|---|---|---|---|---|---|
| phosphor-converted amber source (15) | 9.24 | 7.10 | 4.77 | 3.34 | 3.30 | 3.91 |
| phosphor-converted green source (16) | 2.06 | 1.95 | 7.74 | 9.26 | 8.15 | 4.17 |
| direct emission red source (17) | 0.32 | 0.58 | 1.03 | 1.47 | 1.79 | 2.07 |
| direct emission green source (18) | 2.89 | 4.09 | 5.06 | 6.38 | 8.01 | 9.19 |
| direct emission blue source (19) | 41.53 | 34.61 | 29.90 | 25.55 | 18.54 | 10.00 |
| direct emission cyan source (20) | 43.96 | 51.68 | 51.50 | 54.00 | 60.21 | 70.67 |

13. The lighting assembly according to claim 12, wherein the power supply unit comprises a plurality of power sources controllable to supply the LED light sources of a single LED lighting module independently of each other.

14. The lighting assembly according to claim 12, wherein the control unit is configured to control the plurality of LED light sources on the basis of a colour temperature.

* * * * *